(12) United States Patent
Savich

(10) Patent No.: US 9,404,945 B2
(45) Date of Patent: Aug. 2, 2016

(54) IONIZATION MONITORING DEVICE

(71) Applicant: Desco Industries, Inc., Chino, CA (US)

(72) Inventor: Siarhei V. Savich, Singapore (SG)

(73) Assignee: Desco Industries, Inc., Chino, CA (US)

( * ) Notice: Subject to any disclaimer, the term of this patent is extended or adjusted under 35 U.S.C. 154(b) by 117 days.

(21) Appl. No.: 14/360,705

(22) PCT Filed: Dec. 5, 2012

(86) PCT No.: PCT/US2012/067869
§ 371 (c)(1),
(2) Date: May 27, 2014

(87) PCT Pub. No.: WO2013/085952
PCT Pub. Date: Jun. 13, 2013

(65) Prior Publication Data
US 2014/0333331 A1    Nov. 13, 2014

Related U.S. Application Data

(60) Provisional application No. 61/568,259, filed on Dec. 8, 2011.

(51) Int. Cl.
G01R 19/00 (2006.01)
G01R 27/26 (2006.01)
H01T 23/00 (2006.01)

(52) U.S. Cl.
CPC ........ G01R 19/0061 (2013.01); G01R 27/2605 (2013.01); H01T 23/00 (2013.01)

(58) Field of Classification Search
CPC ............................ G01R 27/2605; G01R 19/00
See application file for complete search history.

(56) References Cited

U.S. PATENT DOCUMENTS 3,908,164 A    9/1975    Parker
4,035,720 A *  7/1977    Harvey ............... G01R 19/252
                                             315/108

(Continued)

FOREIGN PATENT DOCUMENTS

JP    2004111310       4/2004
WO    WO2012078403 A1  6/2012
WO    WO2013085952     6/2013

OTHER PUBLICATIONS

PCT International Search Report for PCT/US2012/067869, mailed on Mar. 22, 2013, 3 pages.

(Continued)

*Primary Examiner* — Jeff Natalini
(74) *Attorney, Agent, or Firm* — Berkeley Law & Technology Group, LLP

(57) ABSTRACT

An air ionization monitoring device 200 and method is disclosed herein. In a described embodiment, the air ionization monitoring device 200 comprises an ion source 202 adapted to emit ions 204 and a capacitor 208 including a first conductor 210 arranged to be exposed to the ions 204 emitted by the ion source 202, and a second conductor 212 arranged to be shielded from the ions 204 emitted by the ion source 202. The monitoring device 200 further includes a commutation circuit 234 operable between a first configuration for charging the capacitor 208 to a first predefined voltage, and a second configuration for using the ions 204 emitted by the ion source 202 to discharge the capacitor 208 for a predefined time resulting in the capacitor 208 having a second voltage. The device 200 is configured to use the first and second voltages to determine an ionic current of the emitted ions.

23 Claims, 4 Drawing Sheets

(56) References Cited

U.S. PATENT DOCUMENTS

| | | |
|---|---|---|
| 4,740,862 A | 4/1988 | Halleck |
| 4,757,422 A | 7/1988 | Bossard |
| 4,829,398 A | 5/1989 | Wilson |
| 4,872,083 A | 10/1989 | Blitshteyn |
| 5,008,594 A | 4/1991 | Swanson |
| 6,075,366 A * | 6/2000 | Yasuda .................. F02P 3/093 324/380 |
| 6,252,756 B1 | 6/2001 | Richie, Jr. et al. |
| 6,433,552 B1 | 8/2002 | Williams |
| 6,717,414 B1 | 4/2004 | Rodrigo et al. |
| 6,850,403 B1 | 2/2005 | Gefter et al. |
| 6,985,346 B2 | 1/2006 | Kraz et al. |
| 7,382,140 B2 * | 6/2008 | Obrecht .................. F23N 5/123 324/678 |
| 7,427,864 B2 | 9/2008 | Williams et al. |
| 7,522,402 B2 | 4/2009 | Kraz et al. |
| 7,586,731 B2 | 9/2009 | Sato et al. |
| 7,612,981 B2 | 11/2009 | Seto et al. |
| 7,649,728 B2 | 1/2010 | Fujita et al. |
| 7,729,101 B2 | 6/2010 | Gefter |
| 2001/0028066 A1 | 10/2001 | Shinohara |
| 2003/0218855 A1 | 11/2003 | Goldenberg |
| 2004/0145852 A1 * | 7/2004 | Kraz ....................... H01T 23/00 361/225 |
| 2004/0207411 A1 | 10/2004 | Kawata |
| 2005/0050948 A1 | 3/2005 | Zhu |
| 2007/0159205 A1 * | 7/2007 | Grund .................. G01R 31/002 324/762.02 |
| 2008/0030918 A1 | 2/2008 | Nakajima |
| 2009/0115345 A1 | 5/2009 | Steffie |
| 2009/0135538 A1 | 5/2009 | Yasuoka |
| 2012/0043972 A1 | 2/2012 | Jayaraman |
| 2013/0088238 A1 * | 4/2013 | Julicher .................. G01N 27/66 324/469 |
| 2013/0154670 A1 * | 6/2013 | Cooke .................... G01N 27/66 324/672 |
| 2013/0271164 A1 * | 10/2013 | Savich ............... G01R 27/2605 324/679 |
| 2014/0333331 A1 | 11/2014 | Savich |

OTHER PUBLICATIONS

Crowley et al., "Equivalent circuites for air ionizers used in static control", Journal of Electrostatics, vol. 61, Issue 2, Jun. 2004, pp. 71-83.

SIPO, "First Office Action", mailed May 8, 2014, CN Application No. 201180058849.9, 13 pgs.

International Preliminary Report on Patentability, mailed Jun. 12, 2013, Appl No. PCT/US2011/062367, filed Nov. 29, 2011, 7 pgs.

JPO, Office Action, mailed Jun. 2, 2015, JP Appl No. 2013-543206 7 pgs.

Response to 1$^{st}$ Office Action, CN Appl No. 201180058849.9 7 pgs.

International Preliminary Report on Patentability, PCT/US2012/067869, WIPO, mailed Jun. 10, 2014, 5 pgs.

PCT International Search Report for PCT/US2011/062367, mailed on Jan. 31, 2012, 4 pgs.

Response to Office Action, U.S. Appl. No. 13/991,926, mailed on Jan. 20, 2016, 23 pgs.

Examiner Interview Summary, U.S. Appl. No. 13/991,926, mailed Aug. 6, 2015, 3 pgs.

Final Office Action, U.S. Appl. No. 13/991,926, mailed Oct. 20, 2015, 35 pgs.

Office Action, U.S. Appl. No. 13/991,926, mailed Apr. 14, 2015, 26 pgs.

Response to Office Action, U.S. Appl. No. 13/991,926, mailed Aug. 12, 2015, 23 pages.

\* cited by examiner

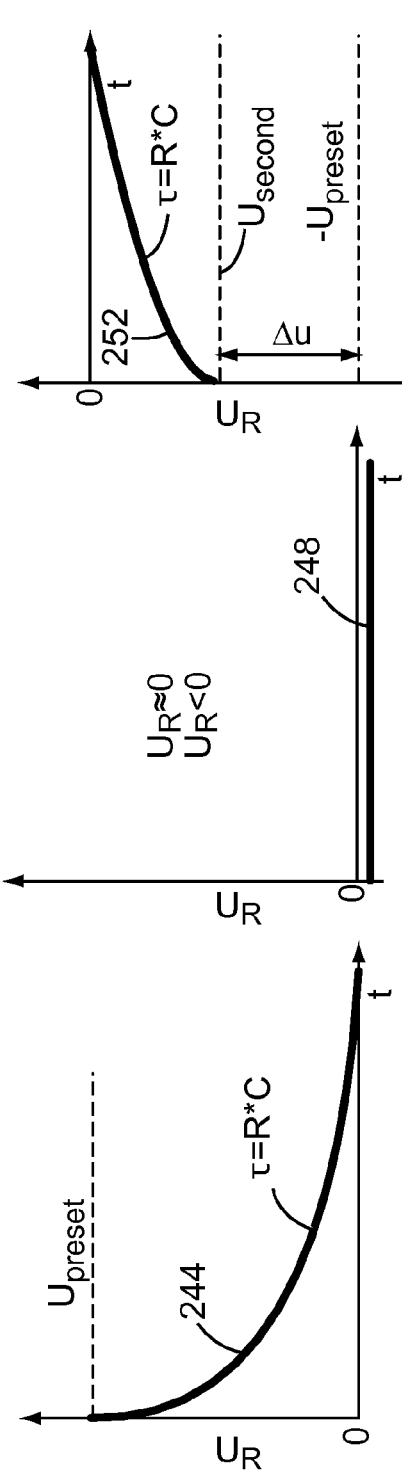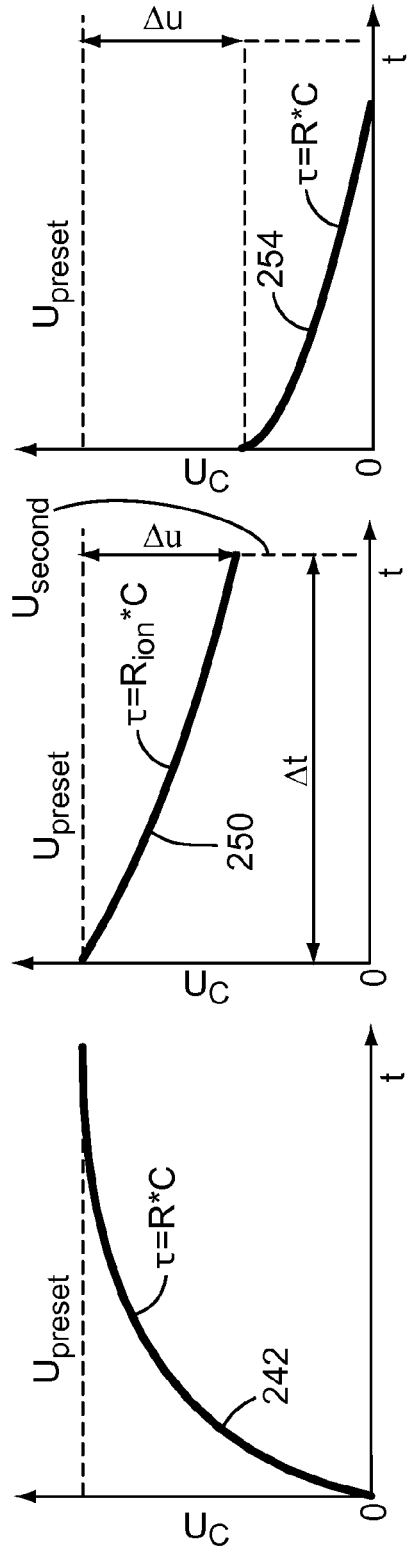
FIG. 4e  FIG. 4c  FIG. 4a
FIG. 4f  FIG. 4d  FIG. 4b

IONIZATION MONITORING DEVICE

TECHNICAL FIELD

This invention relates to an ionization monitoring device and method.

BACKGROUND

Ionization devices or ionizers generate positive and negative ions for delivery to a target area and are commonly used in a wide variety of industries to remove or minimize static charge accumulation in a work area. Ionizers are also commonly referred to as static charge neutralizers.

An example of the ionizer is an ionizing blower. An ionizing blower typically includes an ion source that generates positive ions and negative ions using the so-called "corona method." The ionizing blower includes a fan (or a number of fans) or pressurized gas stream to blow or direct the ions towards a target area.

With the corona method, a high voltage (e.g., 5 kV-20 kV) is applied to a set of sharp points (often needle-like structures), and an intense electric field with ultra-high value of the electric strength vector gradient is established near these sharp points. The electric field accelerates free electrons to a sufficiently high energy in order to allow the free electrons to collide with molecules so as to ionize the molecules. When the voltage on one of the points is positive, positive ions are repelled into the environment and when the voltage on one of the points is negative, negative ions are repelled into the environment.

Corona ionizers may be designed to work with AC voltage or DC voltage, and the use of AC or DC voltage may provide different benefits. Other types of ion sources also exist and may be used in ionization devices. For example, ion sources may also use ionizing radiation to generate ions via the so-called alpha ionizer method.

With ionizers, it is important to monitor efficiency of neutralizing static charge and this is usually measured by discharge time (or decay time), which is the time required for an electrostatic potential of the state charge to be reduced to a given percentage (usually 10%). The decay time may be measured using the so-called CPM (Charge Plate Monitor) method in which a sensor plate is placed at a work area where the ionization is to be measured. The sensor plate is first charged to a preset voltage and then allowed to dissipate to a specified voltage while measuring the duration of the discharge. The sensor plate is typically designed as conductive plate with a fixed plate-to-earth capacitance of 20 pF and the decay time is defined as the time taken for the charge on the sensor plate to drop from 1000V to 100V.

This approach is commonly used to characterize the ionizer but may not be convenient for monitoring because it requires placing the bulky sensor plate at the work area, periodically charging it to a high voltage of 1000V and waiting from seconds to minutes until the plate discharges.

An alternate way to characterize of an ionizer is based on ionic current measurement. Ionic current may comprise a number of ions delivered per unit area to a target area, and may be affected by type and quality of the ion source as well as the strength of the fan (or fans) or gas pressure (for compressed gas ionizers) that deliver the ionized air or gas from the ionization devices. The ion current may be measured using the so-called BPM (Bias Plate Monitor) method in which the sensor plate is connected through an isolated current meter to a high voltage power supply. This technique gives a possibility to determine decay time indirectly on the basis of the ionic current value and may reduce the time of measurement. However, this technique still requires high voltage power supply and additional wiring.

It is an object of the present invention to provide an ionization monitoring device and method to address at least one of the disadvantages of the prior art and/or to provide the public with a useful choice.

SUMMARY

In accordance with a first aspect, there is provided an air ionization monitoring device comprising an ion source adapted to emit ions; a capacitor including a first conductor arranged to be exposed to the ions emitted by the ion source, and a second conductor arranged to be shielded from the ions emitted by the ion source; and a commutation circuit operable between a first configuration for charging the capacitor to a first predefined voltage, and a second configuration for using the ions emitted by the ion source to discharge the capacitor for a predefined time resulting in the capacitor having a second voltage, the device using the first and second voltages to determine an ionic current of the emitted ions.

An advantage of the described embodiment is that since the ionic current may be measured in relation to the second conductor which is shielded from the emitted ions, external static voltage or electromagnetic field, the measurement of the ionic current may be more accurate. Further, since the capacitor is not initially shunted by a resistor, this removes restriction on maximum effective ionization resistance measured value. Also, such a monitoring device may provide valid measurements resulting in shorter periods of time.

The second voltage may be non-zero, between the first predefined voltage and zero, or approximately zero (i.e. the capacitor is fully discharged).

Preferably, the commutation circuit is arranged to switch between the first configuration and the second configuration at periodic intervals. In such a way, this allows the monitoring device to periodically check the effectiveness of the ionization of the ion source.

The commutation circuit may be further operable in a third configuration to completely discharge the capacitor. In this case, the commutation circuit may be arranged to switch between the first configuration, the second configuration and the third configuration at periodic intervals. The third configuration allows the capacitor to be fully discharged to be ready for the next measurement.

Preferably, the air ionization monitoring device may further comprise a processor arranged to control the commutation circuit for switching between the first configuration, the second configuration and the third configuration. In this case, the processor may be controlled by software algorithm and allows independent operation of the monitoring device.

The air ionization monitoring device may further comprise a signal conditioning circuit configured to generate a signal indicative of the ionic current based on the discharge of the capacitor from the first predefined voltage to the second voltage. The processor may then be configured to calculate ionization decay of the ion source based on difference between the first predefined voltage and the second voltage. Preferably, the processor may be further configured to compare the ionization decay with a reference decay and to generate an output signal based on the comparison.

Audible feedback may be used and the output signal may include sounding an alarm if the ionization voltage decay is more than the reference decay.

The signal may include a first signal proportional to the first predefined voltage and a second signal proportional to the second voltage. The ionic current may then be derived from a difference between the first signal and the second signal. Preferably, the signal conditioning circuit comprises an amplifier for amplifying signals corresponding to the first predefined voltage and the second voltage. Advantageously, the signal conditioning circuit may comprise a peak and hold detector for tracking and holding maximum values of the amplified signals for measurement of the second voltage. Further, the signal conditioning circuit may comprise an analog to digital converter for converting the first predefined voltage and the second voltage to digital signals for processing by the controller.

Preferably, the first and second conductors may be separated by a dielectric.

The commutation circuit may include a first switching device for electrically coupling a voltage source to the first conductor and a second switching device electrically coupled to the first conductor for creating a discharge path. In the first configuration, the first switching device may be configured in a closed position and the second switching device may be configured in an open position for the voltage source to charge the charge sensor to the first predefined voltage.

In the second configuration, the first and second switching devices may be configured in open positions. In the third second configuration, the first switching device may be configured in an open position and the second switching device may be configured in a closed position to enable the complete discharging of the capacitor.

Preferably, a first terminal of the voltage source is coupled to the first conductor and a second terminal of the voltage source is coupled a same ground potential as the second conductor. Advantageously, at least during the charging and discharging of the capacitor, the second conductor is configured to be connected to a ground potential. The air ionization monitoring device may comprise an impedance, and the second conductor is connected to the ground potential via the impedance. Preferably, the impedance may include primarily resistive impedance. More preferably, the impedance includes a resistor electrically coupled to the second conductor, and wherein the capacitor may be arranged to be charged to the first predefined voltage through the resistor.

The air ionization monitoring device may further comprise an output grille through which the ions to be emitted exit the ionizer, and the first conductor of the capacitor is disposed at the output grille.

In a second aspect of the invention, there is provided a method of monitoring air ionization, the method comprising emitting ions by an ion source; exposing a capacitor to the ions emitted by the ion source, the capacitor including a first conductor which is exposed to the ions and a second conductor arranged to be shielded from the ions; in a first configuration, charging the charge sensor to a first predefined voltage, in a second configuration, using the ions to discharge the capacitor to a second voltage; and determining an ionic current of the emitted ions based on the first and second voltages.

The method may comprise switching between the first configuration and the second configuration at periodic intervals. The method may also comprise, in a third configuration, completely discharging the capacitor.

Preferably, the method may further comprise switching between the first configuration, the second configuration and the third configuration at periodic intervals. The method may comprise generating a signal indicative of the ionic current based on the discharge of the capacitor from the first predefined voltage to the second voltage. The method may further comprise calculating ionization decay of the ion source based on difference between the first predefined voltage and the second voltage.

Preferably, the method may further comprise comparing the ionization decay with a reference decay and generating an output signal based on the comparison. The method may further comprise sounding an alarm if the ionization voltage decay is more than the reference voltage decay. Specifically, the first configuration may comprise closing a switch, and the second configuration may comprise opening the switch.

It is envisaged that the ion source may not form part of the monitoring device and thus, a general expression of the invention relates to an ionization monitoring device comprising a charge sensor including a first conductor arranged to be exposed to ions and second conductor spaced from the first conductor and arranged to be shielded from the ions; and a commutation circuit operable between a first configuration for charging the charge sensor to a first voltage, and a second configuration to enable the ions to discharge the charge sensor to a second voltage. The charge sensor may be a capacitor and the first and second conductors may be separated by a dielectric. The first voltage may be predefined and the second voltage may be a residual voltage after the first voltage has been discharged by the ions. The ionization monitoring device may be an air ionization monitoring device or a gas ionization monitoring device such as nitrogen.

BRIEF DESCRIPTION OF DRAWINGS

Examples of the invention will now be described with reference to the accompanying drawings, in which:

FIG. 4a is a voltage diagram across a resistor coupled between ground and the capacitor of FIGS. 2 and 3 and with the first switch closed to allow a voltage source to charge the capacitor;

FIG. 4b is a voltage diagram across the capacitor corresponding to FIG. 4a;

FIG. 4c is a voltage diagram across the resistor of FIG. 4a with both the first and second switches in open positions after the capacitor is charged to a preset voltage;

FIG. 4d is a voltage diagram across the capacitor corresponding to FIG. 4c;

FIG. 4e is a voltage diagram across the resistor of FIG. 4c with the first switch in the open position and the second switch in a closed position for the voltage of the capacitor to discharge to a ground plane; and FIG. 4f is a voltage diagram across the capacitor corresponding to FIG. 4e.

DETAILED DESCRIPTION

Figure 1:
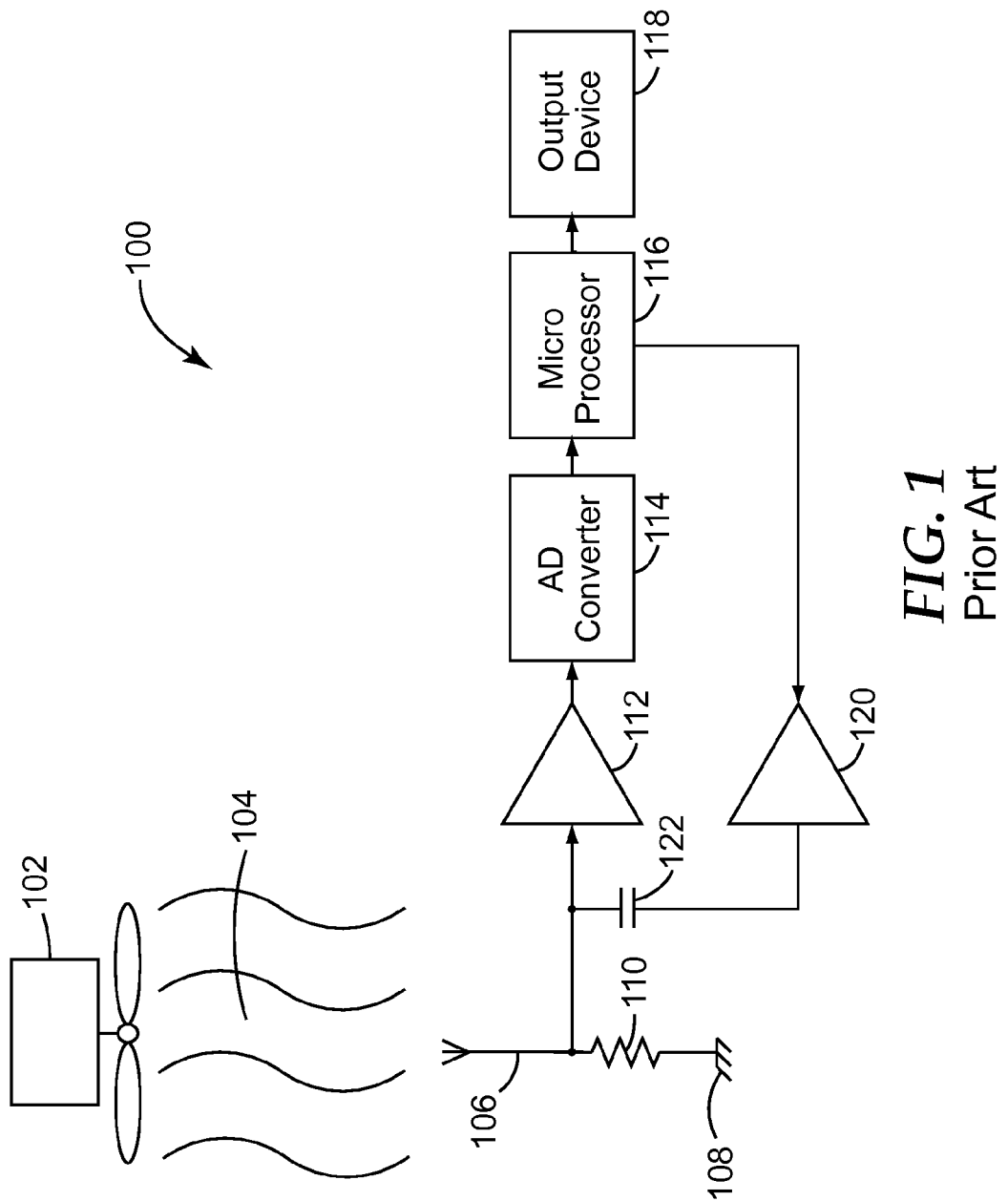
FIG. 1 is a schematic block diagram of a known ionization decay test apparatus.

FIG. 1 is a schematic diagram of a known ionization decay test apparatus 100 based on the understanding that ionization effectiveness is related to equivalent resistance of ionized air or gas and thus, decay time may be obtained based on measurement of such resistance. The apparatus 100 comprises an ion blower 102 for blowing ions 104 emitted by an ion emitter (not shown). The apparatus 100 further includes a sensor plate 106 for receiving the emitted ions 104. The sensor plate 106 is connected to a ground plane 108 through a resistor 110 and is also coupled to an amplifier 112. An output of the amplifier 112 is coupled to an A/D converter 114 which in turn is coupled to a microcontroller 116. The microcontroller 116 is configured to control a display driver 118 and a buffer 120, and the buffer 120 is arranged to charge a capacitor 122 coupled to the sensor plate 106. In other words, the above arrangement allows the sensor plate's output voltage to be charged from the buffer 120 through the capacitor 122.

If the sensor plate 106 is not exposed to the ions 104, a voltage on the sensor plate (for example, as charged through the capacitor 122) is reduced with a time constant determined by values of the resistor 110 and the capacitor 122 and this rate of discharge can be stored in a memory of the microcontroller 116. When the sensor plate 106 is exposed to the ions 104, this accelerates the discharge process based on a new time constant due to the effects of the ions and ionizer decay time may be determined.

The apparatus 100 presupposes that an effective ionization resistance is already shunted by the resistor 110 which may restrict the highest measured effective resistance value. During determination of the ionizer decay time, which may last several seconds, the sensor plate 110 and input of signal conditioning circuit 112 may be affected by external static voltage and electromagnetic field which may cause an artifact in the decay time measurement. In order to improve the accuracy, the decay time may be performed several times and results are averaged but this would significantly increase the measurement time. Additionally, the sensor plate 106 may have quite large output impedance which may require configuring a front end of the conditioning circuit 112 to have very low input current.

Figure 2:
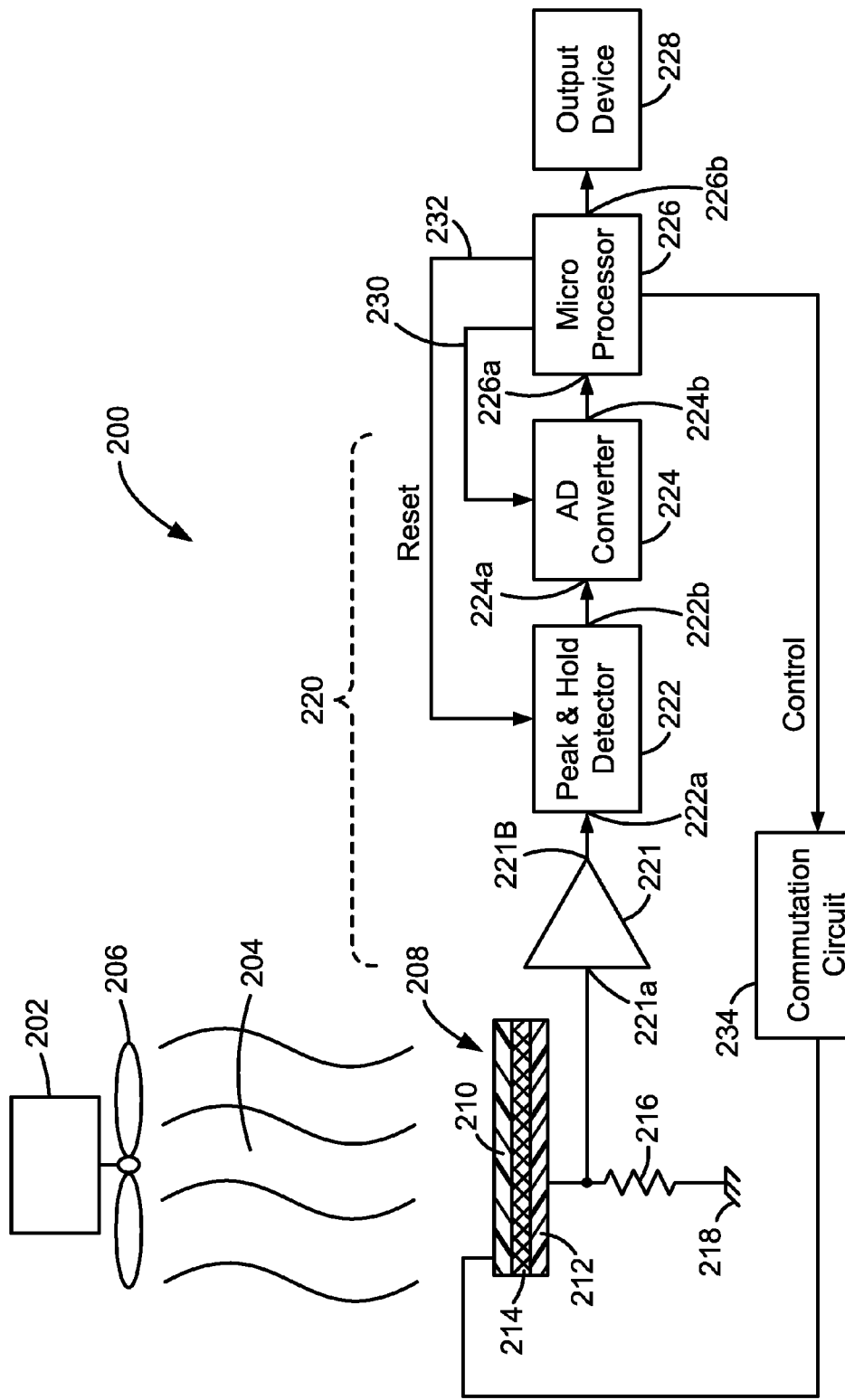
FIG. 2 is a schematic block diagram of an air ionization monitoring device including a capacitor as a charge sensor and a commutation circuit according an embodiment of this invention.

FIG. 2 is a block diagram of an air ionization monitoring device 200 according to an embodiment of the invention. The ionization monitoring device 200 includes an ionizer 202 having an ion emitter (not shown) for emitting ions 204 and a blower 206 for blowing the emitted ions 204 in a particular direction. The ionization device 200 includes a charge sensor and in this embodiment, the charge sensor is in the form of a capacitor 208 having a first conductor 210, a second conductor 212 and a non-conductive layer 214 (such as dielectric) between the first and second conductors 210,212. The first conductor 210 includes an uncovered external plate so that the first conductor 210 is arranged to be exposed to the emitted ions 204. In other words, the first conductor 210 functions as an ion receiver.

The second conductor 212 also includes a plate and a sensor wire or sensor probe (not shown) connected through a small value resistor 216 to a ground plane 218. By "small value", this means that the value of the resistor 216 should not influence the input current of the next stage. The second conductor (and thus, the sensor probe) is configured to be shielded from the emitted ions 204. The probe may also be placed in an enclosed metallic surface to shield it from external fields.

The ionization monitoring device 200 further includes a signal conditioning circuit 220 comprising an amplifier 221, a peak and hold detector 222 and an A/D converter 224. Also, the ionization monitoring device 200 includes a microprocessor 226 and an output device 228.

An output voltage signal of the second conductor 212 is coupled to an input 221a of the amplifier 221 and an output 221b of the amplifier 221 is coupled to a detector input 222a of the peak and hold detector 222. A detector output 222b of the peak and hold detector 222 is coupled to an input 224a of the A/D converter 224. The A/D converter's output 224b is coupled to an input 226a of the microprocessor 226 with the microprocessor's output 226b being coupled to the output device 228. The microprocessor 226 is further configured to control the peak and hold detector 222 and A/D converter 224 via a detector reset signal 230 and a converter reset signal 232.

The ionization monitoring device 200 also includes a commutation circuit 234 coupled to the first conductor 210 and which is controlled by the microprocessor 226. The commutation circuit 234 is configured to connect the first conductor 210 to sources of preset positive or negative voltages, ground plane or to isolate the first conductor 210 from other circuits.

Figure 3:
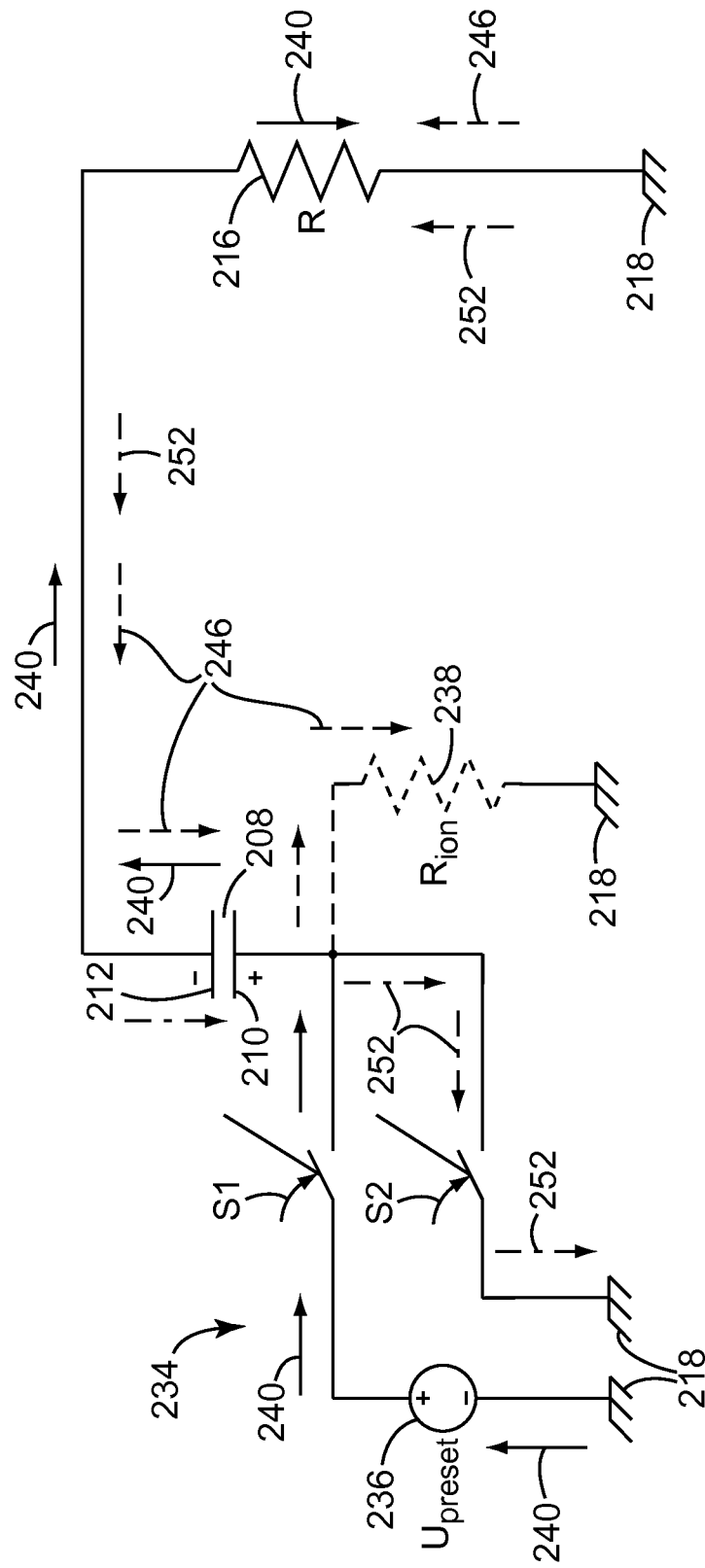
FIG. 3 is an equivalent circuit diagram for ionic current measurement using the commutation circuit and the capacitor of FIG. 2 with the commutation circuit including first and second switches.

FIG. 3 is an equivalent circuit diagram for ionic current measurement using the commutation circuit 234 of FIG. 2. As illustrated in FIG. 3, the commutation circuit 234 includes a voltage source 236, which has a predefined or preset voltage, $U_{preset}$. The voltage source 236 is coupled to the first conductor 210 of the capacitor 208 via a first switch S1. The commutation circuit 234 further includes a second switch S2 which couples the first conductor 210 of the capacitor 208 to the ground plane 218 common to the ground plane of the resistor 216. It is envisaged that the ground plane may not be common to all but it is preferred to be.

The voltage source 236 may have positive or negative polarity relative to the ground plane 218 and in this example, the voltage source has a positive preset voltage $U_{preset}$, of +5V. Effect of the emitted ions on the capacitor 208 may be represented by an ionization resistor 238 (shown in dash lines) which creates a discharge path for the capacitor 208 to the ground plane 218.

An operation of the ionization monitoring device 200 will now be described with reference to FIGS. 2 and 3. At an initial state, both first and second switches S1,S2 are open.

Based on predetermined test algorithms, the microprocessor 226 controls the commutation circuit 234 to be in a first configuration which is to close the first switch S1, which may be controlled to close (and open) at periodic intervals or such time intervals as controlled by the test algorithms. With the first switch S1 closed (and the second switch S2 remaining in the open position), charge current 240 from the voltage source 236 charges the capacitor 208 to the preset voltage $U_{preset}$ and this creates an exponentially decaying voltage across the resistor 216.

FIG. 4a is a voltage diagram across the resistor 216 and FIG. 4b is a voltage diagram across the capacitor 208. When the first switch S1 is first closed, at time t=0, the capacitor 208 is equivalent to a short-circuit and the positive preset voltage $U_{preset}$ is transferred across the resistor 216. Thus, the peak voltage drop across the resistor 216 at time t=0 is the preset voltage $U_{preset}$, as shown in FIG. 4a. Conversely, since the capacitor 208 is equivalent to a short-circuit at time t=0, the voltage drop across the capacitor 216 is zero as shown in FIG. 4b.

Immediately after t=0, the capacitor 208 begins to charge as shown by a rising voltage curve 242 of FIG. 4b and corresponding the voltage across the resistor 216 begins to decline over time as shown by a decaying voltage curve 244 of FIG. 4a. The time for the capacitor to charge and for the voltage across the resistor to discharge is based on $\tau=RC$ where R is the value of the resistor 216 and C is the capacitance of the capacitor 208.

With the capacitor 208 charged to the preset voltage $U_{preset}$, this is passed on to the signal conditioning circuit 220 for generating a first signal corresponding to the preset voltage $U_{preset}$. Specifically, the amplifier 221 is arranged to generate a first amplified signal proportionate to the preset voltage $U_{preset}$. The peak and hold detector 222 is configured to track and hold maximum values of the first amplified signal and passes the maximum values to the A/D converter 224 for conversion to digital values (being the first signal) and then to the microprocessor 226. After a prescribed time (as predetermined) in which the capacitor 208 is charged to $U_{preset}$, the microprocessor 226 switches the commutation circuit 234 to a second configuration which is to open the first switch S1 (with the second switch S2 remaining as open) to use or allow the emitted ions 204 to discharge the voltage, $U_{preset}$, of the capacitor 208. The effect is illustrated in FIG. 3 as discharge current 246 (dash arrows) discharging through the ionization resistor 238 and the resistor 216, and naturally, the voltage across the capacitor 208 decreases.

FIG. 4c is a voltage diagram across the resistor 216 illustrating a drop in the voltage with both the first and second switches S1,S2 in the open positions. The voltage across the resistor 216 is represented by a negative voltage level 248. FIG. 4d is a voltage diagram across the capacitor 208 with both the switches S1,S2 in the open positions and showing the effects of the emitted ions 204 on the capacitor 208 as a decaying curve 250 from $U_{preset}$ to a second voltage $U_{second}$. From FIG. 4d, it can be appreciated that the preset voltage $U_{preset}$ discharges based on a time constant of $\tau_{ion} = R_{ion}C$; where $R_{ion}$ is resistance of the ionization resistor 238 and C is the capacitance of the capacitor 208.

After lapse of a specific time $\Delta t$, the emitted ions 204 would have discharged the voltage of the capacitor (with the first conductor 210 being exposed to the emitted ions 204) to a certain extent and the residual voltage is represented as $U_{second}$ in FIG. 4d. The voltage of the capacitor 208 would thus have decreased by $\Delta U$ which is a difference between $U_{preset}$ and $U_{second}$. The ionic current magnitude is then determined based on $\Delta U$, and indeed, the ionic current magnitude has been found to be proportional to $\Delta U$ during the time period $\Delta t$.

$U_{second}$ may be measured when the capacitor 208 is connected to the ground plane 218 when the second switch S2 is closed which is a third configuration of the commutation circuit 234.

FIG. 4e is a voltage diagram across the resistor 216 and FIG. 4f is a corresponding voltage diagram across the capacitor 208 when the first switch S1 remained open, and the second switch S2 is closed. At the initial moment (t=0) after the second switch S2 is closed, the voltage spike created across the resistor 216 is equal to the residual voltage $U_{second}$ of the capacitor 208 but has an opposite polarity as shown in FIG. 4e. With the second switch S2 closed, this creates a second discharge path for the voltage of the capacitor 208 to discharge and this is illustrated by discharge current 252 (dash-dotted arrows) and correspondingly a discharge curve 254 of FIG. 4f. At t=0 when the second switch S2 is closed, the signal conditioning circuit 220 generates a second signal proportionate to the residual voltage $U_{second}$ for handling by the microprocessor 226. Specifically, the amplifier 221 is arranged to generate a second amplifier signal based on the residual voltage and the peak and hold detector 222 is configured to track and hold maximum values of the peak of the second amplified signal in order for the peak to be processed by the microprocessor 226 to determine the ionic current measurement. It should be appreciated that the peak amplitude of the voltage across the resistor 208 is inversely proportional to the ionic current value and proportional to the effective resistance of the ionized medium.

Based on the ionic current value, the microprocessor 226 then determines an associated ionization decay or efficiency of the ionization, compares the ionization decay with a reference decay and generates an output via the output device 228. Depending on the result, the output device generates corresponding outputs to feedback the result to a user. For example, an alarm may be sounded to warn the user that the decay time is greater than the reference decay.

Once the microprocessor 226 is able to determine the residual voltage $U_{second}$, the microprocessor 226 then activates the detector and converter reset signals 230,232 to reset the peak and hold detector 222 and the A/D converter 224 to be ready for the next measurement. In the third configuration with the second switch S2 closed, the capacitor 208 is thus completely discharged if $U_{second}$ is a non-zero value as shown by the curve 254 of FIG. 4f based on a time contact similar to that of FIG. 4a.

To generalize the above operation, the capacitor 208 is charged to the preset voltage $U_{preset}$ of +5V in the first configuration and then the monitoring device 200 is switched to the second configuration to allow the emitted ions to discharge the preset voltage over a predefined time period (which may vary depending on application) and to obtain the second voltage $U_{second}$. Once the value of the second voltage $U_{second}$ is obtained, the commutation circuit 234 is operated in the third configuration to discharge fully the capacitor 208. The value of the second voltage $U_{second}$ thus depends on the operation of the ionizer 202 and in particular the ionization current due to the ionization effect. Based on the difference between $U_{preset}$ and $U_{second}$, it is possible to determine decay time. Depending on $\Delta t$, the second voltage $U_{second}$ may be a value between $U_{preset}$ and zero, a non-zero value or perhaps a zero value (completely discharged).

The operations of the first and second switches S1, S2 of the commutation circuit 234 are controlled by the microprocessor 226 and in other words, the microprocessor 226 controls the commutation circuit 234 to operate between the first, second and third configurations. However, it is envisaged that instead of the microprocessor 226 which is internal to the monitoring device 200, the control of the commutation circuit 234 may be carried out externally, for example by connecting the monitoring device 200 to an external computing device.

It should be appreciated that the described embodiment has several advantages. Since the capacitor 208 is not initially shunted by a resistor, this removes restriction on the maximum effective ionization resistance measured values. Further, with the second conductor carrying the sensor probe shielded from the emitted ions 204, external static voltage and electromagnetic field, this makes measurement of the ionic current much more reliable. In this arrangement, the sensor probe may have very low output impedance which makes it much easier to match with the signal conditioning circuit 220 and this increases noise immunity of the sensor probe too. The capacitor discharge time $\Delta t$ is easily controlled by the microprocessor 226 which makes it possible to measure the ion current in wide dynamic ranges without making any or much hardware changes.

The described embodiments should not be construed as limitative. For example, the ionization monitoring device 200 may not include the ion emitter 202 and the device 200 may be retrofitted to existing ionizers. In this case, the voltage source 236 may be external to the ionization monitoring device. The device 200 may also be coupled to an existing ionizer by a data cable which includes tapping the power supply from the existing ionizer.

The described embodiment uses the positive voltage source 236 as an example, and the voltage source may be negative. Indeed, the commutation circuit 234 may include a positive voltage source (coupled to the first conductor 210 capacitor 208 via the first switch S1) and a negative voltage source which is coupled to the first conductor 210 of the capacitor 208 via a third switch. In this way, a negative voltage of say −5V could be used to charge the capacitor 208 and measurement made to determine a corresponding ionic current based on how much of the negative charge has been reduced over a time period. In this way, decay time may also be determined. It should be appreciated that the operation of the third switch is similar to the first switch S1 and no further elaboration is needed.

Instead of air, the monitoring device may be adapted to work with gas ionizers too, such as nitrogen.

In the described embodiment, the output voltage signal of the capacitor 208 is passed to the amplifier 221 and the amplified signal is passed to the input of peak and hold detector 222. The detected output is then passed to the A/D converter 224 to be digitized. However, this may not be necessary so. For example, the peak and hold detector 222 may be eliminated and the output 220b of the amplifier 221 may be connected directly to the input 224a of AD convertor 224. Alternatively, both the peak and hold detector 222 and the A/D converter 224 may be eliminated and the output of amplifier 221 may be connected directly to the microprocessor 226 which implements an internal A/D conversion.

In the described embodiment, instead of switches S1,S2 other types of switching devices may be used such as relay switches.

In the described embodiment, all the ground planes 218 are common and indeed, at least during the charging and discharging of the capacitor 208, the second conductor 212 is connected to a ground potential and preferably, the ground potential is common to the ground plane coupled to the voltage source 236. In this way, this ensures common reference ground during the discharge process when the commutation circuit is in the second configuration and when the commutation circuit is in the third configuration.

In the described embodiment, the second conductor 212 of the capacitor 208 is coupled to ground via a resistor 216. However, it is envisaged that other forms of impedance may be used, although preferably, the impedance is primarily resistive. The capacitor 208 is used as a specific example in the described embodiment but a more general charge sensor for sending the emitted ions may be used. Specifically, the charge sensor includes a pair of conductors separated by a dielectric and the pair of conductors is similar to the first conductor 210 and the second conductor 212 of the capacitor 208 with one of the pair being exposed to the emitted ions 204 and the second of the pair being shielded by the emitted ions 204. Preferably, the second of the pair is shielded from the emitted ions 204 by the first one of the pair, similar to the configuration of the capacitor 208.

Item 1 is an air ionization monitoring device comprising
an ion source adapted to emit ions;
a capacitor including a first conductor arranged to be exposed to the ions emitted by the ion source, and a second conductor arranged to be shielded from the ions emitted by the ion source; and
a commutation circuit operable between a first configuration for charging the capacitor to a first predefined voltage, and a second configuration for using the ions emitted by the ion source to discharge the capacitor for a predefined time resulting in the capacitor having a second voltage, the device using the first and second voltages to determine an ionic current of the emitted ions.

Item 2 is an air ionization monitoring device according to item 1, the second voltage is non-zero.

Item 3 is an air ionization monitoring device according to item 1, wherein the second voltage is between the first predefined voltage and zero.

Item 4 is an air ionization monitoring device according to item 1, wherein after discharging for the predefined time, the capacitor is fully discharged.

Item 5 is an air ionization monitoring device according to item 1, wherein the commutation circuit is arranged to switch between the first configuration and the second configuration at periodic intervals.

Item 6 is an air ionization monitoring device according to item 1, wherein the commutation circuit is further operable in a third configuration to completely discharge the capacitor.

Item 7 is an air ionization monitoring device according to item 6, wherein the commutation circuit is arranged to switch between the first configuration, the second configuration and the third configuration at periodic intervals.

Item 8 is an air ionization monitoring device according to item 6, further comprising a processor arranged to control the commutation circuit for switching between the first configuration, the second configuration and the third configuration.

Item 9 is an air ionization monitoring device according to item 8, further comprising a signal conditioning circuit configured to generate a signal indicative of the ionic current based on the discharge of the capacitor from the first predefined voltage to the second voltage.

Item 10 is an air ionization monitoring device according to item 8, wherein the processor is configured to calculate ionization decay of the ion source based on difference between the first predefined voltage and the second voltage.

Item 11 is an air ionization monitoring device according to item 10, wherein the processor is further configured to compare the ionization decay with a reference decay and to generate an output signal based on the comparison.

Item 12 is an air ionization monitoring device according to item 11, wherein the output signal includes sounding an alarm if the ionization voltage decay is more than the reference decay.

Item 13 is an air ionization monitoring device according to item 9, wherein the signal includes a first signal proportional to the first predefined voltage and a second signal proportional to the second voltage.

Item 14 is an air ionization monitoring device according to item 14, wherein the ionic current is derived from a difference between the first signal and the second signal.

Item 15 is an air ionization monitoring device according to item 9, wherein the signal conditioning circuit comprises an amplifier for amplifying signals corresponding to the first predefined voltage and the second voltage.

Item 16 is an air ionization monitoring device according to item 15, wherein the signal conditioning circuit comprises a peak and hold detector for tracking and holding maximum values of the amplified signals for measurement of the second voltage.

Item 17 is an air ionization monitoring device according to item 16, wherein the signal conditioning circuit further comprises an analog to digital converter for converting the first predefined voltage and the second voltage to digital signals for processing by the processor.

Item 18 is an air ionization monitoring device according to item 1, wherein the first and second conductors are separated by a dielectric.

Item 19 is an air ionization monitoring device according to item 7, wherein the commutation circuit includes a first switching device for electrically coupling a voltage source to the first conductor and a second switching device electrically coupled to the first conductor for creating a discharge path.

Item 20 is an air ionization monitoring device according to item 19, wherein in the first configuration, the first switching device is configured in a closed position and the second switching device is configured in an open position for the voltage source to charge the charge sensor to the first predefined voltage.

Item 21 is an air ionization monitoring device according to item 20, wherein in the second configuration, the first and second switching devices are configured in open positions.

Item 22 is an air ionization monitoring device according to item 7, wherein in the third second configuration, the first switching device is configured in an open position and the second switching device is configured in a closed position to enable the complete discharging of the capacitor.

Item 23 is an air ionization monitoring device according to item 19, wherein a first terminal of the voltage source is coupled to the first conductor and a second terminal of the voltage source is coupled a same ground potential as the second conductor.

Item 24 is an air ionization monitoring device according to item 1, wherein at least during the charging and discharging of the capacitor, the second conductor is configured to be connected to a ground potential.

Item 25 is an air ionization monitoring device according to item 24, further comprising an impedance, and the second conductor is connected to the ground potential via the impedance.

Item 26 is an air ionization monitoring device, according to item 25, wherein the impedance includes primarily resistive impedance.

Item 27 is an air ionization monitoring device according to item 25, wherein the impedance includes a resistor electrically coupled to the second conductor, and wherein the capacitor is arranged to be charged to the first predefined voltage through the resistor.

Item 28 is an air ionization monitoring device according to item 1, further comprising an output grille through which the ions to be emitted exit the ionizer, wherein the first conductor of the capacitor is disposed at the output grille.

Item 29 is a method of monitoring air ionization, the method comprising
emitting ions by an ion source;
exposing a capacitor to the ions emitted by the ion source, the capacitor including a first conductor which is exposed to the ions and a second conductor arranged to be shielded from the ions;
in a first configuration, charging the charge sensor to a first predefined voltage,
in a second configuration, using the ions to discharge the capacitor to a second voltage; and
determining an ionic current of the emitted ions based on the first and second voltages.

Item 30 is a method according to item 29, further comprising switching between the first configuration and the second configuration at periodic intervals.

Item 31 is a method according to item 30, further comprising, in a third configuration, completely discharging the capacitor.

Item 32 is a method according to item 31, further comprising switching between the first configuration, the second configuration and the third configuration at periodic intervals.

Item 33 is a method according to item 32, further comprising generating a signal indicative of the ionic current based on the discharge of the capacitor from the first predefined voltage to the second voltage.

Item 34 is a method according to item 33, further comprising calculating ionization decay of the ion source based on difference between the first predefined voltage and the second voltage.

Item 35 is a method according to item 34, further comprising comparing the ionization decay with a reference decay and generating an output signal based on the comparison.

Item 36 is a method according to item 35, further comprising sounding an alarm if the ionization voltage decay is more than the reference voltage decay.

Item 37 is a method according to item 29, wherein the first configuration comprises closing a switch.

Item 38 is a method according to item 37, wherein the second configuration comprises opening the switch.

Having now fully described the invention, it should be apparent to one of ordinary skill in the art that many modifications can be made hereto without departing from the scope as claimed.

The invention claimed is:

1. An air ionization monitoring device comprising:
an ion source adapted to emit ions;
a capacitor including a first conductor arranged to be exposed to the ions emitted by the ion source, and a second conductor arranged to be shielded from the ions emitted by the ion source; and
a commutation circuit operable between a first configuration for charging the capacitor to a first predefined voltage, and a second configuration for using the ions emitted by the ion source to discharge the capacitor for a predefined time resulting in the capacitor having a second voltage, the device using the first predefined voltage and the second voltage to determine an ionic current of the emitted ions.

2. The air ionization monitoring device according to claim 1, wherein the second voltage is non-zero.

3. The air ionization monitoring device according to claim 1, wherein the commutation circuit is further operable in a third configuration to completely discharge the capacitor.

4. The air ionization monitoring device according to claim 3, wherein the commutation circuit is arranged to switch between the first configuration, the second configuration and the third configuration at periodic intervals.

5. The air ionization monitoring device according to claim 3, further comprising a processor arranged to control the commutation circuit for switching between the first configuration, the second configuration and the third configuration.

6. The air ionization monitoring device according to claim 5, further comprising a signal conditioning circuit configured to generate a signal indicative of the ionic current based on the discharge of the capacitor from the first predefined voltage to the second voltage.

7. The air ionization monitoring device according to claim 6, wherein the signal includes a first signal proportional to the first predefined voltage and a second signal proportional to the second voltage.

8. The air ionization monitoring device according to claim 7, wherein the ionic current is derived from a difference between the first predefined signal and the second signal.

9. The air ionization monitoring device according to claim 6, wherein the signal conditioning circuit comprises an amplifier for amplifying signals corresponding to the first predefined voltage and the second voltage.

10. The air ionization monitoring device according to claim 9, wherein the signal conditioning circuit comprises a peak and hold detector for tracking and holding maximum values of the amplified signals for measurement of the second voltage.

11. The air ionization monitoring device according to claim 10, wherein the signal conditioning circuit further comprises an analog to digital converter for converting the first predefined voltage and the second voltage to digital signals for processing by the processor.

12. The air ionization monitoring device according to claim 5, wherein the processor is configured to calculate ionization decay of the ion source based on a difference between the first predefined voltage and the second voltage.

13. The air ionization monitoring device according to claim 12, wherein the processor is further configured to compare the ionization decay with a reference decay and to generate an output signal based on the comparison.

14. The air ionization monitoring device according to claim 13, further comprising an alarm configured to be activated by the output signal if the ionization voltage decay is more than the reference decay.

15. The air ionization monitoring device according to claim 1, wherein the first and second conductors are separated by a dielectric.

16. The air ionization monitoring device according to claim 1, wherein at least during the charging and discharging of the capacitor, the second conductor is configured to be connected to a ground potential.

17. The air ionization monitoring device according to claim 16, further comprising an impedance, and wherein the second conductor is connected to the ground potential via the impedance.

18. The air ionization monitoring device, according to claim 17, wherein the impedance includes primarily resistive impedance.

19. The air ionization monitoring device according to claim 17, wherein the impedance includes a resistor electrically coupled to the second conductor, and wherein the capacitor is arranged to be charged to the first predefined voltage through the resistor.

20. The air ionization monitoring device according to claim 1, wherein the second voltage is between the first predefined voltage and zero.

21. The air ionization monitoring device according to claim 1, wherein after discharging for the predefined time, the capacitor is fully discharged.

22. The air ionization monitoring device according to claim 1, wherein the commutation circuit is arranged to switch between the first configuration and the second configuration at periodic intervals.

23. The air ionization monitoring device according to claim 1, further comprising an output grille through which the ions to be emitted exit the ionizer, wherein the first conductor of the capacitor is disposed at the output grille.

* * * * *